(12) United States Patent
Van De Kerkhof et al.

(10) Patent No.: US 8,629,418 B2
(45) Date of Patent: *Jan. 14, 2014

(54) LITHOGRAPHIC APPARATUS AND SENSOR THEREFOR

(75) Inventors: Marcus Adrianus Van De Kerkhof, Helmond (NL); Haico Victor Kok, Eindhoven (NL); Borgert Kruizinga, Zoetermeer (NL); Timotheus Franciscus Sengers, s-Hertogenbosch (NL); Bearrach Moest, Eindhoven (NL); Marc Antonius Maria Haast, Eindhoven (NL); Peter Werner Weissbrodt, Weimar (DE); Manfred Helmut Gustav Wilhelm Johannes Schrenk, Kahla (DE); Torsten Harzendorf, Jena (DE)

(73) Assignee: ASML Netherlands B.V., Veldhoven (NL)

(*) Notice: Subject to any disclaimer, the term of this patent is extended or adjusted under 35 U.S.C. 154(b) by 1208 days.

This patent is subject to a terminal disclaimer.

(21) Appl. No.: 11/591,674

(22) Filed: Nov. 2, 2006

(65) Prior Publication Data

US 2007/0108377 A1    May 17, 2007

Related U.S. Application Data

(63) Continuation-in-part of application No. 11/067,491, filed on Feb. 28, 2005, now Pat. No. 7,282,701.

(51) Int. Cl.
*G01N 15/06* (2006.01)
*H01J 3/14* (2006.01)

(52) U.S. Cl.
USPC .......................................... 250/573; 250/216

(58) Field of Classification Search
USPC ............ 250/227.25, 216, 234, 548, 573, 574; 355/53, 71, 67–69; 356/520, 399–401
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 4,509,852 A | 4/1985 | Tabarelli et al. | 355/30 |

(Continued)

FOREIGN PATENT DOCUMENTS

| | | |
|---|---|---|
| CN | 2158291 | 3/1994 |
| CN | 1123444 | 5/1996 |

(Continued)

OTHER PUBLICATIONS

Roland Winston, "Light Colletion within the Framework of Geometrical Optics", Journal of the Optical Society of America, vol. 60, No. 1, pp. 245-247 (Feb. 1970).

(Continued)

*Primary Examiner* — Pascal M Bui Pho
(74) *Attorney, Agent, or Firm* — Pillsbury Winthrop Shaw Pittman LLP (57) ABSTRACT

A sensor for use at substrate level in a high numerical aperture lithographic apparatus, the sensor having a transparent plate that covers a sensing element and includes elements that improve coupling of radiation into the sensing element. The improved coupling elements include a flowing liquid medium disposed between the transparent plate and the sensing element.

23 Claims, 6 Drawing Sheets

(56) References Cited

U.S. PATENT DOCUMENTS

| | | | |
|---|---|---|---|
| 4,540,277 A | 9/1985 | Mayer et al. | |
| 5,610,683 A | 3/1997 | Takahashi | |
| 5,636,189 A | 6/1997 | Park | |
| 5,715,039 A | 2/1998 | Fukuda et al. | |
| 5,777,971 A | 7/1998 | Choi | |
| 5,825,043 A | 10/1998 | Suwa | |
| 5,841,520 A | 11/1998 | Taniguchi | |
| 6,084,844 A | 7/2000 | Takeda | |
| 6,781,670 B2 * | 8/2004 | Krautschik | 355/53 |
| 6,862,384 B2 | 3/2005 | Koshi et al. | |
| 6,940,582 B1 | 9/2005 | Tanaka | |
| 6,981,775 B2 | 1/2006 | Tenmyo | |
| 7,213,963 B2 | 5/2007 | Lof et al. | |
| 7,256,868 B2 * | 8/2007 | Akamatsu | 355/53 |
| 7,453,078 B2 * | 11/2008 | Kok et al. | 250/548 |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik et al. | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0002004 A1 | 1/2005 | Kolesnychenko et al. | |
| 2005/0007569 A1 | 1/2005 | Streefkerk et al. | |
| 2005/0007570 A1 | 1/2005 | Streefkerk et al. | |
| 2005/0018155 A1 | 1/2005 | Cox et al. | |
| 2005/0018156 A1 | 1/2005 | Mulkens et al. | |
| 2005/0024609 A1 | 2/2005 | De Smit et al. | |
| 2005/0030497 A1 | 2/2005 | Nakamura | |
| 2005/0030498 A1 | 2/2005 | Mulkens | |
| 2005/0030506 A1 | 2/2005 | Schuster | |
| 2005/0030511 A1 | 2/2005 | Auer-Jongepier et al. | |
| 2005/0036121 A1 | 2/2005 | Hoogendam | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048220 A1 | 3/2005 | Mertens et al. | |
| 2005/0048223 A1 | 3/2005 | Pawloski et al. | |
| 2005/0052632 A1 | 3/2005 | Miyajima | |
| 2005/0068639 A1 | 3/2005 | Pierrat et al. | |
| 2005/0073670 A1 | 4/2005 | Carroll | |
| 2005/0078286 A1 | 4/2005 | Dierichs et al. | |
| 2005/0078287 A1 | 4/2005 | Sengers et al. | 355/30 |
| 2005/0084794 A1 | 4/2005 | Meagley et al. | |
| 2005/0088635 A1 | 4/2005 | Hoogendam et al. | |
| 2005/0094114 A1 | 5/2005 | Streefkerk et al. | |
| 2005/0094116 A1 | 5/2005 | Flagello et al. | |
| 2005/0094119 A1 | 5/2005 | Loopstra et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146693 A1 | 7/2005 | Ohsaki | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Zaal et al. | |
| 2005/0225737 A1 | 10/2005 | Weissenrieder et al. | |
| 2005/0231694 A1 | 10/2005 | Kolesnychenko et al. | |
| 2005/0233081 A1 | 10/2005 | Tokita | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0254026 A1 * | 11/2005 | Tokita | 355/30 |
| 2005/0259232 A1 | 11/2005 | Streefkerk et al. | |
| 2005/0259233 A1 | 11/2005 | Streefkerk et al. | |
| 2005/0259236 A1 | 11/2005 | Straaijer | |
| 2005/0264778 A1 | 12/2005 | Lof et al. | |
| 2005/0270505 A1 | 12/2005 | Smith | |
| 2006/0192093 A1 | 8/2006 | Kok et al. | |
| 2006/0274297 A1 | 12/2006 | Ogusu | |

FOREIGN PATENT DOCUMENTS

| | | |
|---|---|---|
| CN | 1146595 | 4/1997 |
| CN | 1194434 | 9/1998 |
| CN | 1359016 | 7/2002 |
| CN | 1506745 | 6/2004 |
| CN | 1573564 | 2/2005 |
| DE | 221 563 | 4/1985 |
| DE | 224448 | 7/1985 |
| EP | 03252955.4 | 5/2003 |
| EP | 1 420 300 A2 | 5/2004 |
| EP | 1 486 828 A2 | 12/2004 |
| EP | 1 500 986 A1 | 1/2005 |
| EP | 1 510 870 A1 | 3/2005 |
| JP | A 57-153433 | 9/1982 |
| JP | 58-202448 | 11/1983 |
| JP | A 59-19912 | 2/1984 |
| JP | 62-65326 | 3/1987 |
| JP | 63-157419 | 6/1988 |
| JP | 4-305915 | 10/1992 |
| JP | 4-305917 | 10/1992 |
| JP | A 05-62877 | 3/1993 |
| JP | 6-124873 | 5/1994 |
| JP | 07-220990 | 8/1995 |
| JP | 07-270189 A | 10/1995 |
| JP | 08-219712 A | 8/1996 |
| JP | A 08-316125 | 11/1996 |
| JP | A-8-316133 | 11/1996 |
| JP | 10-303114 | 11/1998 |
| JP | 10-340846 | 12/1998 |
| JP | A-11-176727 | 7/1999 |

(56) References Cited

FOREIGN PATENT DOCUMENTS

| | | | |
|---|---|---|---|
| JP | 2000-058436 | * | 2/2000 |
| JP | A-2000-58436 | | 2/2000 |
| JP | A-2004-301825 | | 10/2004 |
| JP | A-2005-93948 | | 4/2005 |
| JP | 2005-5707 A | | 7/2006 |
| WO | 99/49504 | | 9/1999 |
| WO | WO 01/08205 A1 | | 1/2001 |
| WO | WO 02/091078 A1 | | 11/2002 |
| WO | WO 03/077037 | | 9/2003 |
| WO | WO 2004/019128 | | 3/2004 |
| WO | WO 2004/055803 A1 | | 7/2004 |
| WO | WO 2004/057589 A1 | | 7/2004 |
| WO | WO 2004/057590 A1 | | 7/2004 |
| WO | WO 2004/077154 A2 | | 9/2004 |
| WO | WO 2004/081666 A1 | | 9/2004 |
| WO | WO 2004/090577 A2 | | 10/2004 |
| WO | WO 2004/090633 A2 | | 10/2004 |
| WO | WO 2004/090634 A2 | | 10/2004 |
| WO | WO 2004/092830 A2 | | 10/2004 |
| WO | WO 2004/092833 A2 | | 10/2004 |
| WO | WO 2004/093130 A2 | | 10/2004 |
| WO | WO 2004/093159 A2 | | 10/2004 |
| WO | WO 2004/093160 A2 | | 10/2004 |
| WO | WO 2004/095135 A2 | | 11/2004 |
| WO | WO 2005/001432 A2 | | 1/2005 |
| WO | WO 2005/001572 A2 | | 1/2005 |
| WO | WO 2005/003864 A1 | | 1/2005 |
| WO | WO 2005/006026 A2 | | 1/2005 |
| WO | WO 2005/008339 A2 | | 1/2005 |
| WO | WO 2005/013008 A2 | | 2/2005 |
| WO | WO 2005/015283 A1 | | 2/2005 |
| WO | WO 2005/017625 A2 | | 2/2005 |
| WO | WO 2005/019935 A2 | | 3/2005 |
| WO | WO 2005/022266 A2 | | 3/2005 |
| WO | WO 2005/024325 A2 | | 3/2005 |
| WO | WO 2005/024517 A2 | | 3/2005 |
| WO | WO 2005/034174 A2 | | 4/2005 |
| WO | WO 2005/050324 A2 | | 6/2005 |
| WO | WO 2005/054953 A2 | | 6/2005 |
| WO | WO 2005/054955 A2 | | 6/2005 |
| WO | WO 2005/059617 A2 | | 6/2005 |
| WO | WO 2005/059618 A2 | | 6/2005 |
| WO | WO 2005/059645 A2 | | 6/2005 |
| WO | WO 2005/059654 A1 | | 6/2005 |
| WO | WO 2005/062128 A2 | | 7/2005 |
| WO | WO 2005/064400 A2 | | 7/2005 |
| WO | WO 2005/064405 A2 | | 7/2005 |
| WO | WO 2005/069055 A2 | | 7/2005 |
| WO | WO 2005/069078 A1 | | 7/2005 |
| WO | WO 2005/069081 A2 | | 7/2005 |
| WO | WO 2005/071491 A2 | | 8/2005 |
| WO | WO 2005/074606 A2 | | 8/2005 |
| WO | WO 2005/076084 A1 | | 8/2005 |
| WO | WO 2005/081030 A1 | | 9/2005 |
| WO | WO 2005/081067 A1 | | 9/2005 |
| WO | WO 2005/098504 A1 | | 10/2005 |
| WO | WO 2005/098505 A1 | | 10/2005 |
| WO | WO 2005/098506 A1 | | 10/2005 |
| WO | WO 2005/106589 A1 | | 11/2005 |
| WO | WO 2005/111689 A2 | | 11/2005 |
| WO | WO 2005/111722 A2 | | 11/2005 |
| WO | WO 2005/119368 A2 | | 12/2005 |
| WO | WO 2005/119369 A1 | | 12/2005 |

OTHER PUBLICATIONS

European Search Report issued in EP Appl. No. 06 25 0875 dated Aug. 29, 2006.
Emerging Lithographic Technologies VI, Proceedings of SPIE, vol. 4688 (2002), "Semiconductor Foundry, Lithography, and Partners", B.M. Lin, pp. 11-24.
Optical Microlithography XV, Proceedings of SPIE vol. 4691, (2002), "Resolution Enhancement of 157nm Lithography by Liquid Immersion", M. Switkes et al., pp. 459-465.
J. Microlith., Microfab., Microsyst., vol. 1, No. 3, Oct. 2002, Society of Photo-Optical Instrumentation Engineers, "Resolution enhancement of 157 nm lithography by liquid immersion", M. Switkes et al., pp. 1-4.
Optical Microlithography XVI, Proceedings of SPIE vol. 5040 (2003), "Immersion lithography; its potential performance and issues", Soichi OWA et al., pp. 724-733.
Information Disclosure Statement filed Aug. 31, 2007 for U.S. Appl. No. 11/896,447.
English translation of Official Action issued on Sep. 8, 2008 in corresponding Japanese Application No. 2006-049444.
English translation of Official Action issued on Dec. 10, 2009 in corresponding Taiwanese Application No. 095104987.
Chinese Office Action dated Oct. 16, 2009 in corresponding Chinese Patent Application No. 200610019816.4.
Chinese Office Action dated Apr. 13, 2010 in corresponding Chinese Patent Application No. 200610019816.4.

* cited by examiner

LITHOGRAPHIC APPARATUS AND SENSOR THEREFOR

The present application is a continuation-in-part and claims priority to U.S. patent application Ser. No. 11/067,491, filed Feb. 28, 2005, now U.S. Pat. No. 7,282,701 which is incorporated herein by reference in its entirety.

FIELD OF THE INVENTION

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as enabling the use of a larger effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
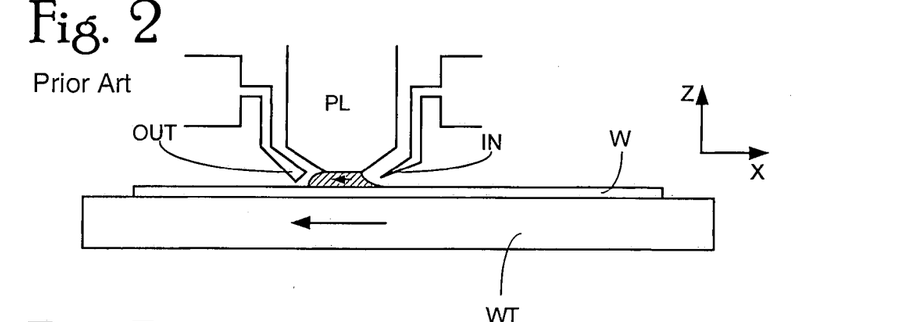
FIGS. 2 and 3 depict a liquid supply system used in a prior art lithographic projection apparatus.
Figure 3:
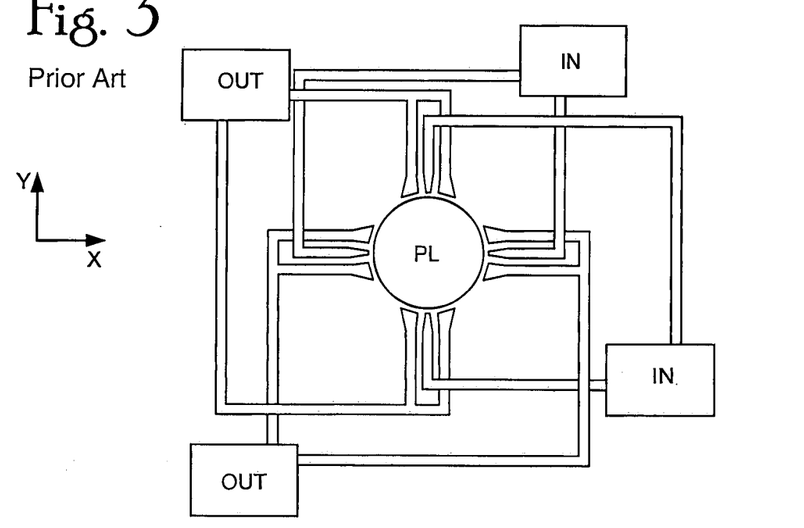

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
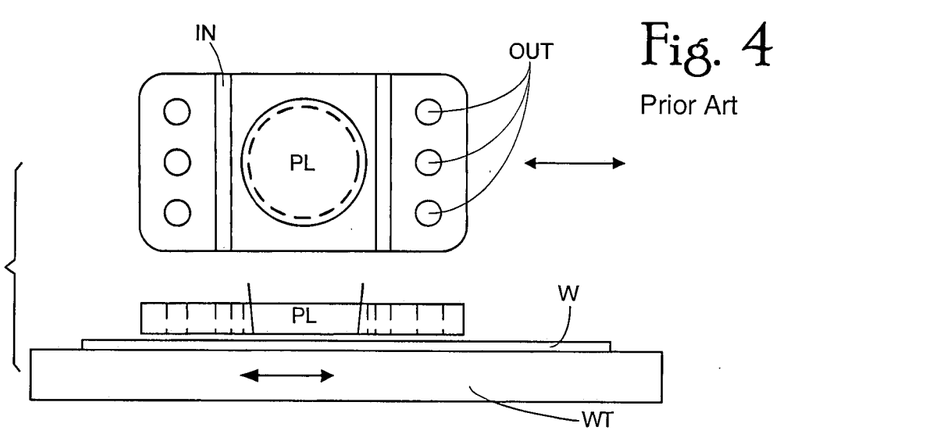
FIG. 4 depicts a liquid supply system according to another prior art lithographic projection apparatus.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such as system with a gas seal is disclosed in European Patent Application No. 03252955.4 hereby incorporated in its entirety by reference.

In European Patent Application No. 03257072.3 the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

A number of sensors are used at substrate level for evaluating and optimizing imaging performance. These may include transmission image sensors (TIS), spot sensors for measuring exposure radiation dose and integrated lens interferometers at scanner (ILIAS). TIS and ILIAS are described below.

A TIS is a sensor that is used to measure the position at substrate level of a projected aerial image of a mark pattern at the mask (reticle) level. The projected image at substrate level may be a line pattern with a line width comparable to the wavelength of the exposure radiation. The TIS measures these mask patterns using a transmission pattern with a photocell underneath it. The sensor data may be used to measure the position of the mask with respect to the substrate table in six degrees of freedom (three in translation and three in rotation). In addition, the magnification and scaling of the projected mask may be measured. Since the sensor is preferably capable of measuring the pattern positions and influences of all illumination settings (sigma, lens NA, all masks (binary, PSM, etc.)) a small line width is preferable. The TIS may also be used to measure the optical performance of the tool. Different illumination settings are used in combination with different projected images for measuring properties such as pupil shape, coma, spherical aberration, astigmatism and field curvature.

An ILIAS is an interferometric wavefront measurement system that may perform static measurements on lens aberrations up to high order. It may be implemented as an integrated measurement system used for system initialization and calibration. Alternatively, it may be used for monitoring and recalibration "on-demand".

In systems with high NA and in particular in immersion systems, it has been found that conventional sensors at substrate level suffer poor or no sensitivity to radiation arriving at angles corresponding to an NA of greater than 1. NA is defined as n.sin(θ) where n is the refractive index of the material between the last element of the projection system and the substrate and θ is the angle to the normal of the radiation furthest from the normal.

SUMMARY

It is desirable to provide a sensor at substrate level with high sensitivity and which is suitable for use in a high NA system.

In accordance with one embodiment of the present invention, there is provided a sensor for use at a substrate level in a lithographic projection apparatus having a projection system that is configured to project a patterned radiation beam onto a target portion of a substrate, the sensor comprising: a radiation-detector; a transmissive plate having a front surface and a back surface, the transmissive plate being positioned such that radiation projected by the projection system passes into the front surface of the transmissive plate and out of the back surface thereof to the radiation detector; and a luminescent layer provided on the back surface of the transmissive plate, the luminescent layer absorbing the radiation and emitting luminescent radiation of a different wavelength, wherein the back surface is rough.

In accordance with another embodiment of the present invention, there is provided a sensor for use at a substrate level in a lithographic projection apparatus having a projection system that is configured to project a patterned radiation beam onto a target portion of a substrate, the sensor comprising: a radiation-detector; a transmissive plate having a front surface and a back surface, the transmissive plate being positioned such that radiation projected by the projection system passes into the front surface of the transmissive plate and out of the back surface thereof to the radiation detector; and a Fresnel lens provided on the back surface of the transmissive plate and arranged to couple radiation to the radiation detector.

In accordance with one embodiment of the present invention, there is provided a sensor for use at a substrate level in a lithographic projection apparatus having a projection system that is configured to project a patterned radiation beam onto a target portion of a substrate, the sensor comprising: a radiation-detector; and a transmissive plate having a front surface and a back surface, the transmissive plate being positioned such that radiation that is projected by the projection system passes into the front surface of the transmissive plate and out of the back surface thereof to the radiation detector; wherein a region of the transmissive plate through which the radiation passes has a gradient in its refractive index such that the radiation is refracted towards a normal to the back surface of the transmissive plate.

In accordance with one embodiment of the present invention, there is provided a sensor for use at a substrate level in a lithographic projection apparatus having a projection system that is configured to project a patterned radiation beam onto a target portion of a substrate, the sensor comprising: a radiation-detector; a transmissive plate having a front surface and a back surface, the transmissive plate being positioned such that radiation that is projected by the projection system passes into the front surface of the transmissive plate and out of the back surface thereof to the radiation detector; and an inverted Winston cone provided on the back surface of the transmissive plate and arranged to couple radiation to the radiation detector.

In accordance with one embodiment of the present invention, there is provided a sensor for use at a substrate level in a lithographic projection apparatus having a projection system that is configured to project a patterned radiation beam onto a target portion of a substrate, the sensor comprising: a radiation-detector; and a transmissive plate having a front surface and a back surface, the transmissive plate being positioned such that radiation projected by the projection system passes into the front surface of the transmissive plate and out of the back surface thereof to the radiation detector; wherein the radiation detector is mounted directly onto the back surface of the transmissive plate.

In accordance with one embodiment of the present invention, there is provided a sensor for use at a substrate level in a lithographic projection apparatus having a projection system that is configured to project a patterned radiation beam onto a target portion of a substrate, the sensor comprising: a radiation-detector; a transmissive plate having a front surface and a back surface, the transmissive plate being positioned such that radiation projected by the projection system passes into the front surface of the transmissive plate and out of the back surface thereof to the radiation detector; and a holographic optical element that is provided on the back surface of the transmissive plate and arranged to couple radiation to the radiation detector.

In accordance with one embodiment of the present invention, there is provided a sensor for use at a substrate level in a lithographic projection apparatus having a projection system that is configured to project a patterned radiation beam onto a target portion of a substrate, the sensor comprising: a radiation-detector; a transmissive plate having a front surface and a back surface, the transmissive plate being positioned such that radiation projected by the projection system passes into the front surface of the transmissive plate and out of the back surface thereof to the radiation detector; a convex spherical lens being provided on the back surface of the transmissive plate; and a cylindrical reflector surrounding the convex spherical lens and arranged to couple radiation exiting the convex spherical lens to the radiation detector.

In accordance with one embodiment of the present invention, there is provided a sensor for use at a substrate level in a lithographic projection apparatus having a projection system that is configured to project a patterned radiation beam onto a target portion of a substrate, the sensor comprising: a radiation-detector; a transmissive plate having a front surface and a back surface, the transmissive plate being positioned such that radiation projected by the projection system passes into the front surface of the transmissive plate and out of the back surface thereof to the radiation detector; a cylindrical body being provided on the back surface of the transmissive plate and being arranged to couple radiation to the radiation detector, the cylindrical body having a reflective coating on its curved side surface and a concave recess in its end surface facing the sensor.

In an embodiment of the present invention, a sensor for use at a substrate level in a lithographic projection apparatus having a projection system that is configured to project a patterned radiation beam onto a target portion of a substrate, comprises a radiation-detector, a transmissive plate having a front surface and a back surface, the transmissive plate being positioned such that radiation projected by the projection system passes into the front surface of the transmissive plate and out of the back surface thereof to the radiation detector, and a gap region disposed between the transmissive plate and radiation detector, wherein the gap region is configured to house a flowing liquid medium.

In yet another embodiment of the present invention, a sensor for use at a substrate level in a lithographic projection apparatus having a projection system that is configured to project a patterned radiation beam onto a target portion of a substrate, the sensor comprises a radiation-detector, a transmissive plate having a front surface and a back surface, the transmissive plate being positioned such that radiation projected by the projection system passes into the front surface of the transmissive plate and out of the back surface thereof to the radiation detector, and a gap region disposed between the transmissive plate and radiation detector, wherein the gap region is configured to house an index-matched fluid, the index-matched fluid comprising a refractive index similar to that of the transmissive plate, wherein Fresnel reflections for radiation passing out of the back surface of the transmissive plate are minimized.

In a further embodiment of the present invention, a sensor for use at a substrate level in a lithographic projection apparatus having a projection system that is configured to project a patterned radiation beam onto a target portion of a substrate, the sensor comprises a radiation-detector, a transmissive plate having a front surface and a back surface, the transmissive plate being positioned such that radiation projected by the projection system passes into the front surface of the transmissive plate and out of the back surface thereof to the radiation detector, a gap region disposed between the transmissive plate and radiation detector, a flowing liquid medium disposed within and passing through the gap region, the liquid medium configured to conduct heat away from the sensor, a luminescent layer disposed between the back surface of the transmissive plate and the radiation detector, and a protective coating disposed on the radiation detector.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the Figures, corresponding reference symbols indicate corresponding parts.

DETAILED DESCRIPTION

Figure 1:
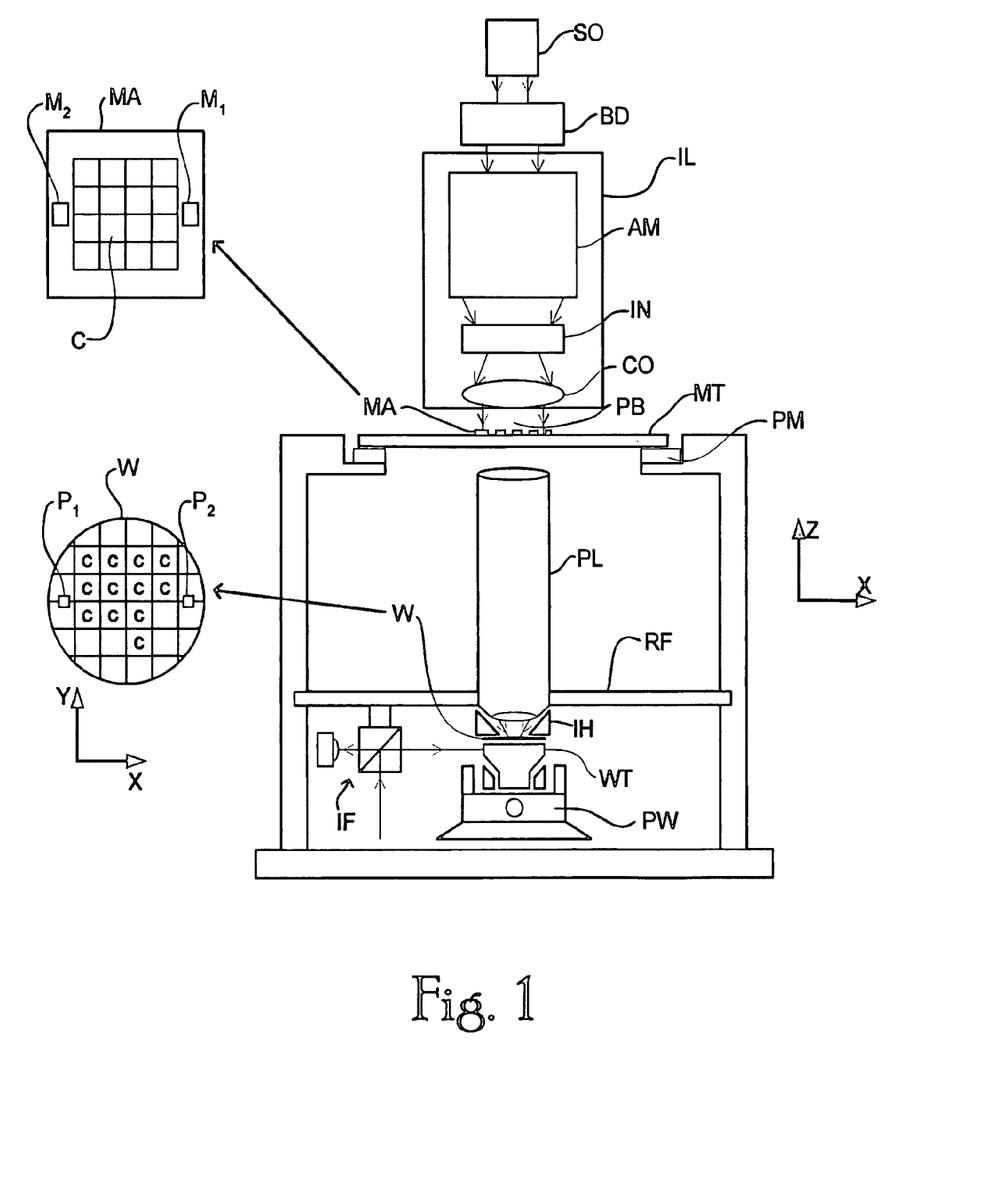
FIG. 1 depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
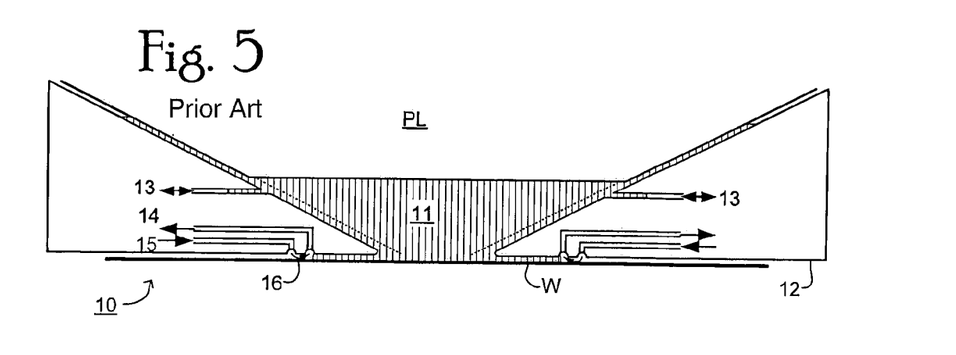
FIG. 5 depicts a liquid supply system according to another prior art lithographic projection apparatus.

As shown in FIG. 5, a liquid supply system is used to supply liquid to the space between the final element of the projection system and the substrate. The reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air but preferably N2 or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity air flow inwards that confines the liquid.

Figure 6:
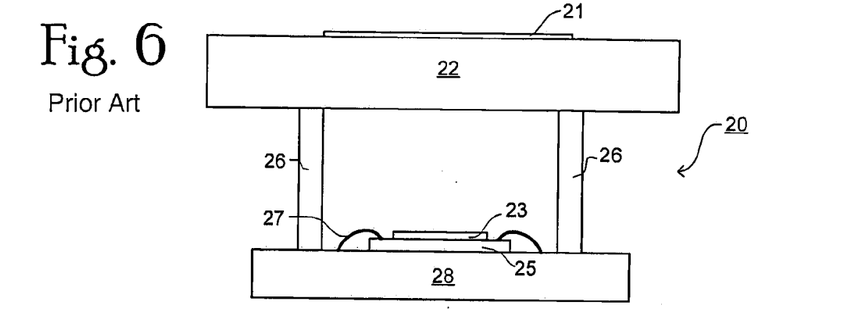
FIG. 6 depicts an ILIAS sensor module according to the prior art.

FIG. 6 shows an ILIAS sensor module 20 according to the prior art. This module has a shearing grating structure 21 as a radiation-receiving element, supported by a transmissive plate 22, which may be made of glass or quartz. A quantum conversion layer 23 is positioned immediately above a camera chip 25 (a radiation-detecting element), which is in turn mounted on a substrate 28. The substrate 28 is connected to the transmissive plate 22 via spacers 26 and bonding wires 27 that connect the radiation-detecting element to external instrumentation. An air gap is located between the quantum conversion layer 23 and the transmissive plate 22. In a setup such as this designed to be sensitive to 157 nm radiation, for example, the air gap within the sensor cannot easily be purged so that it will contain significant proportions of oxygen and water, which absorb radiation. As a result, signals may be lost. Due to the large difference in refractive index between the quartz or glass sealing plate 22 and the air in the gap, the critical angle is small and radiation at larger angles to the normal, corresponding to NA>1, may be lost. In addition to signal loss, the sensitivity of the sensor may not uniform with angle of incidence. Thus, the sensor of the present invention may have particular advantages where used in a projection system having a numeric aperture greater than 1, as will be appreciated from the disclosure herein.

The air gap shown in FIG. 6 can be eliminated or reduced by extending the transmissive plate material or luminescent layer between the transmissive plate and radiation detector, as disclosed in U.S. patent application Ser. No. 10/924,202; Filed: Aug. 24, 2004 and incorporated by reference herein in its entirety.

FIGS. 7 to 15 depict improved substrate-level sensors according to embodiments of the invention. In the following embodiments, parts that are equivalent to parts of the sensor of FIG. 6 are identified by like reference numerals and a detailed description is omitted for conciseness.

Figure 7:
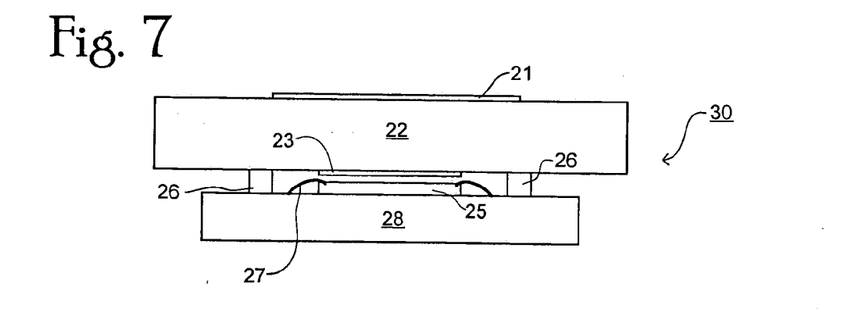
FIG. 7 depicts a sensor module according to an embodiment of the present invention.
Figure 8:
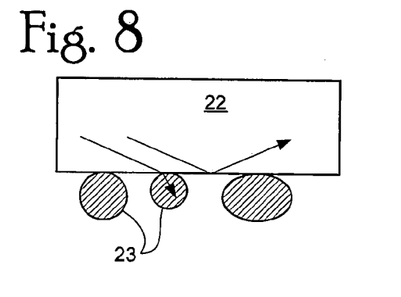
FIG. 8 depicts radiation coupling into a luminescence layer without surface roughening.

In the embodiment of FIG. 7, the quantum conversion (luminescent) layer 23 is positioned on the back surface of the transparent plate 22, rather than on the front of the camera chip (radiation detecting element) 25. As the quantum conversion layer has a higher refractive index than air, the critical angle is larger and less radiation is internally reflected in the transparent plate 22. However, as shown in FIG. 8, the material of the quantum conversion layer, which may be a phosphor, is porous, so there may be incomplete coverage of the back surface of the transparent plate 22. Thus, more radiation is internally reflected in the transparent plate 22 than would be expected. The sensitivity of the sensor may be improved by making the back surface 22a of the transparent plate 22 rough.

Figure 9:
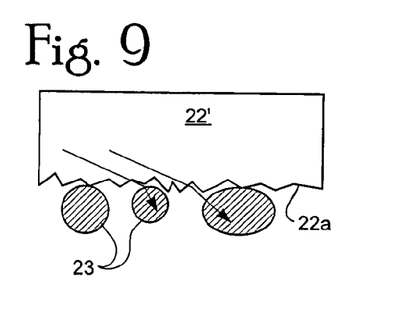
FIG. 9 depicts radiation coupling into a luminescence layer with surface roughening.

The roughness of surface 22a has the effect that radiation propagating through the transparent plate encounters areas of the surface 22a at a variety of angles. There is therefore a loss of transmission at angles close to the (global) normal but an increase in transmission at angles further from the global normal, as shown in FIG. 9. The net effect is an increase in the uniformity of the sensor responsivity with incident angle. The diffuseness of the surface may cause some blurring of the image on the camera 25, but this is acceptable especially if it is less than the pixel size, e.g. 25 μm, and can therefore be neglected. The camera 25 may therefore need to be close to or directly against the conversion layer 23. Alternatively, a lens or fiber-optic bundle may be used to couple the radiation emitted by the conversion layer 23 to the camera without loss of spatial information.

The roughness of the surface 22a can be created by any known method, including omitting final polishing steps in the manufacture of the plate.

The surface roughness should be such that the variation in slope across the surface is at least as large as the amount by which the NA is greater than 1, i.e. $\Delta\theta > \sin^{-1}(NA-1)$. This ensures that a ray at the maximum NA will always have an angle of incidence less than the critical angle at some point on the surface.

The roughness RDq determined by a surface roughness tester should be larger than $\tan(\sin^{-1}(NA-1))$, e.g. in the range of from 0.1 to 0.5.

Figure 10:
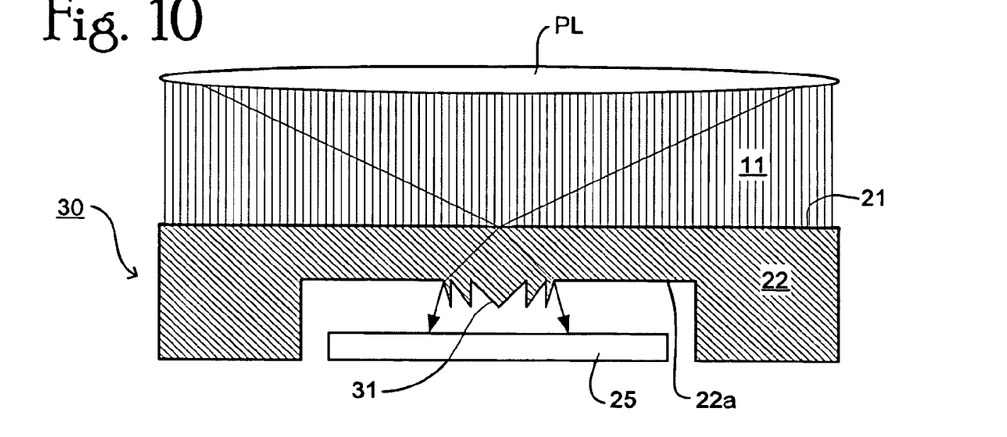
FIG. 10 depicts another sensor module according to an embodiment of the present invention.

A further embodiment of the sensor 30, shown in FIG. 10, has a Fresnel lens 31 formed in the back surface 22a of the transparent plate 22. The Fresnel lens is designed such that all radiation passing through the aperture (e.g. pin hole or grating) in chrome layer 21 is incident at the quartz or glass/air interface at less than the critical angle. The Fresnel lens can be formed by many known techniques, e.g. lithographic patterning and etching.

Figure 11:
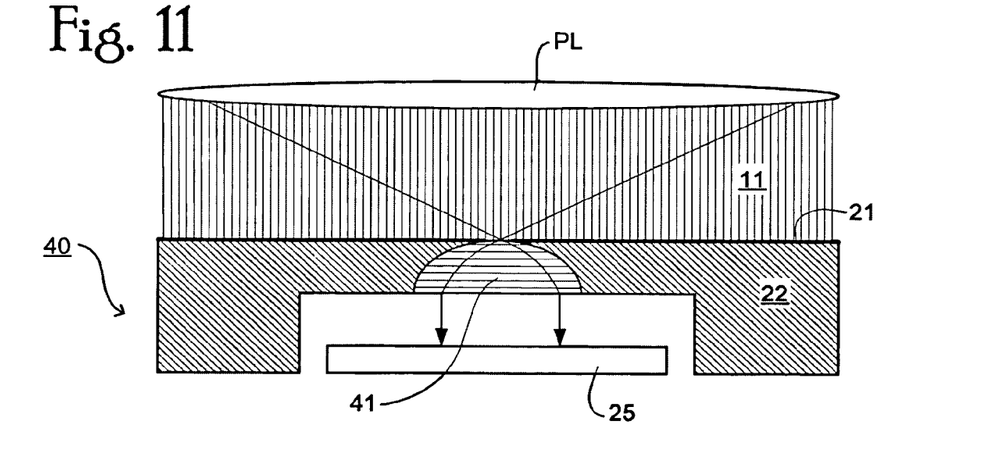
FIG. 11 depicts another sensor module according to an embodiment of the present invention.

A sensor 40 according to a further embodiment is shown in FIG. 11 and has a region 41 in the transparent plate behind the aperture (e.g. pin hole or grating) in chrome layer 21 that has a gradient in its refractive index. This can be created by locally selective doping of the quartz or glass material forming transparent plate 22 and makes it possible to arrange that all rays passing through the aperture are incident on the quartz/air interface at near normal angles.

Figure 12:
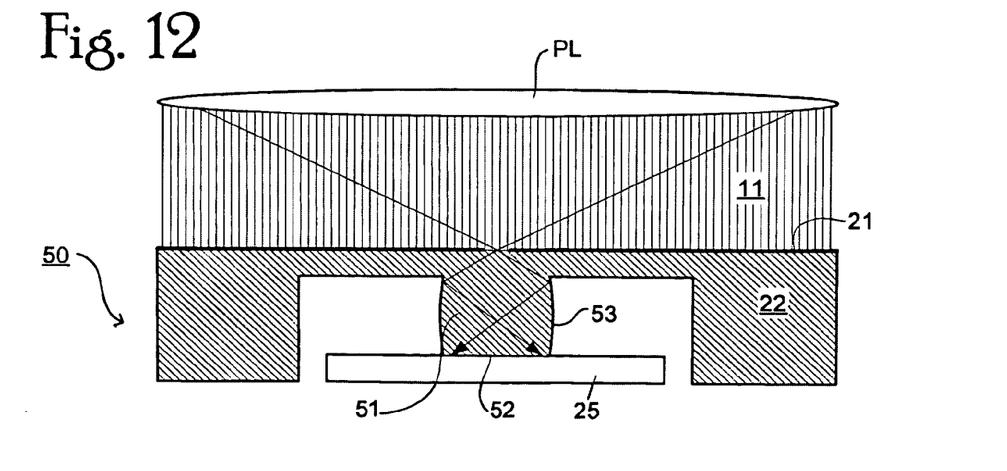
FIG. 12 depicts another sensor module according to an embodiment of the present invention.

FIG. 12 shows a further embodiment of a sensor 50 which uses an inverted Winston cone 51 to reflect all the rays so that they are incident on the bottom surface 52 at less than the critical angle, so there is no internal reflection and maximum transmission into the sensor 25. A Winston cone is an off-axis parabola of revolution designed to maximize collection of incoming rays within some field of view and is described further in Winston, R. "Light Collection within the Framework of Geometric Optics." *J. Opt. Soc. Amer.* 60, 245-247, 1970, which document is hereby incorporated by reference in its entirety. The Winston cone 51 in this embodiment is a solid piece of quartz or glass, preferably formed integrally with the transparent plate 22, and has a reflective coating on its side surfaces 53.

Figure 13:
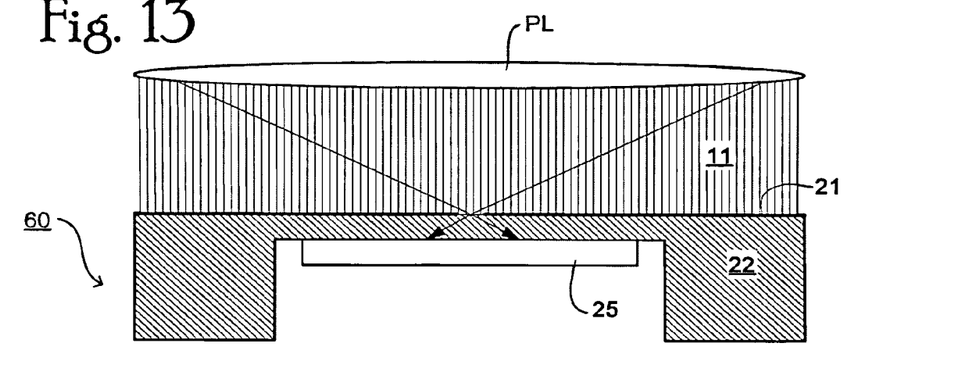
FIG. 13 depicts another sensor module according to an embodiment of the present invention.

In sensor 60, shown in FIG. 13, the sensor 25 is mounted directly onto the back surface 22a of the transparent plate 22. For this purpose a glue that is stable under the radiation to be detected and has a refractive index close to that of the quartz or glass of the transparent plate 22 can be used.

Figure 14:
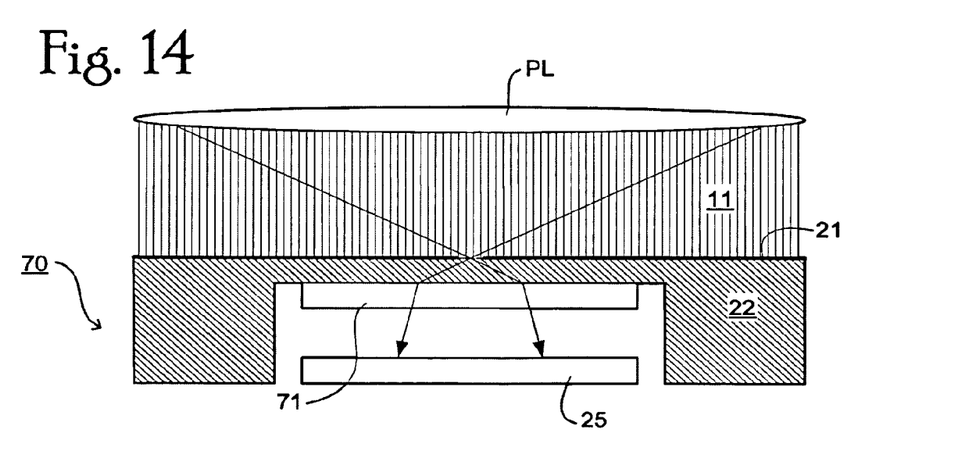
FIG. 14 depicts another sensor module according to an embodiment of the present invention.

A further sensor 70, show in FIG. 14, uses a holographic element 71 located on the back surface of transparent plate 22, to direct radiation onto the sensor 25. The holographic pattern required can readily be made by known techniques. A diffractive optical element may be used instead.

Figure 15:
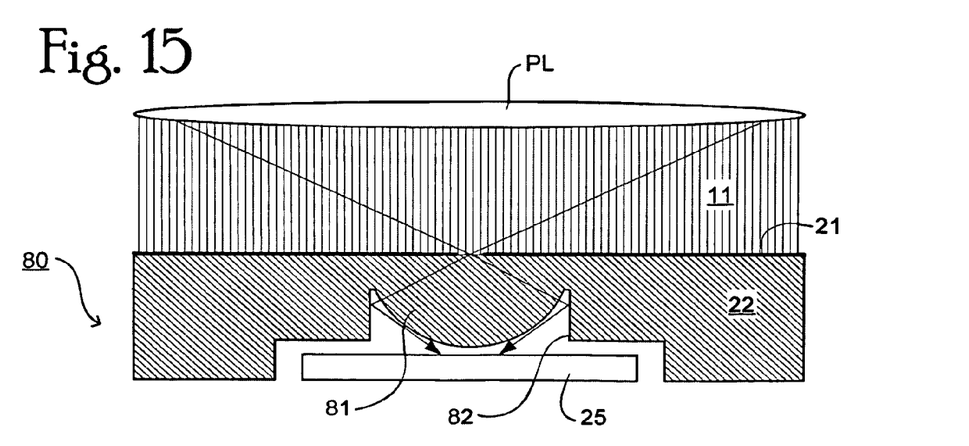
FIG. 15 depicts another sensor module according to an embodiment of the present invention.

As shown in FIG. 15, a sensor 80 according to a further embodiment has a convex spherical lens 81 formed in the back surface of transparent plate 22 and a reflective cylinder 82 to direct radiation to the sensor 25. The spherical lens 81 has its center close to the aperture in the chrome layer 21 so that the angles of incidence at the quartz/air interface are near normal for all rays.

The spherical lens 81 is preferably formed integrally with the transparent plate but may also be formed as a separate body and attached using a suitable glue, i.e. one that is stable under the exposure radiation and has a refractive index close to that of the lens.

However, the cylindrical reflector 82 is preferably made as a separate body and attached to the transparent substrate or sensor thereafter. This is because the requirements on the manner and accuracy of its attachment are considerably less strict than those on its shape.

Figure 16:
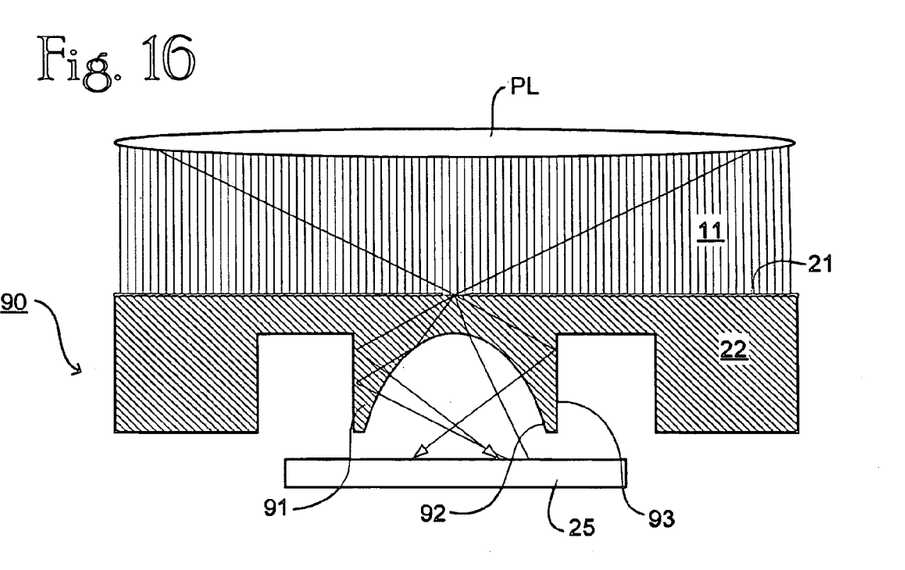
FIG. 16 depicts another sensor module according to an embodiment of the present invention.

In the embodiment of FIG. 16, the sensor 90 has a cylindrical projection 91 provided on the rear side of the transparent plate 22. The distal end of the projection has a concave cut-away shape, forming a lens. The outer surface 93 of the projection 91 is polished and coated to increase its reflectivity. The concave surface may also be coated to increase its transmissivity. As shown in the figure, radiation can reach the sensor 25 by one of three routes. At small angles to the normal, the radiation will pass directly through the concave surface 92 to reach the sensor 25. At larger angles to the normal, the radiation will be internally reflected at the concave surface 92 and be reflected by the side surface 93 back on to the concave surface 92, which it will pass through to reach the sensor. At still larger angles to the normal, the radiation will be reflected by the side surface 93 to pass through the concave surface 92 and thence to the sensor.

Figure 17:
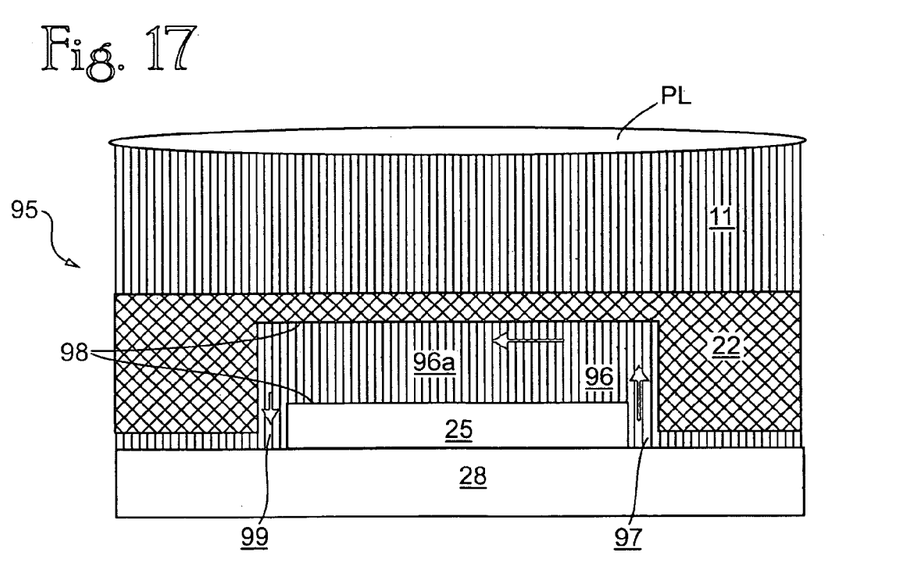
FIG. 17 depicts a sensor module arranged in accordance with another embodiment of the present invention.

FIG. 17 depicts a sensor 95 arranged in accordance with another embodiment of the present invention. Sensor 95 is arranged to incorporate a flowing liquid, such as water, within the gap region 96 between chip 25 and transmissive plate 22. Sensor 95 is configured to allow continuous water flow in region 96. In the example shown in FIG. 17, liquid inlet 97 and outlet 99 are provided adjacent to chip 25. Inlet 97 and outlet 99 are disposed in a peripheral portion of gap region 96 such that neither inlet 97 nor outlet 99 lies in region 96*a* between chip 25 and transmissive plate 22. However, other configurations of inlets and outlets are possible. The use of flowing water can aid operation in a hyper-NA system. This is because the presence of water below transmissive plate 22 prevents total internal reflection of radiation that might otherwise occur at the bottom of transmissive plate 22 in the presence of an air gap in region 96, due to the large decrease in refractive index experienced by radiation propagating through plate 22 and into an air medium.

The use of flowing water in sensor 95 also acts as an index-matching fluid (in other words, the refractive index of water is similar to quartz, which is often used for the transmissive plate material), thus minimizing Fresnel reflections and polarization effects. In embodiments of the present invention where sensor 95 contains a multi-channel detector, for example, a TIS, the index-matching minimizes channel crosstalk.

The use of flowing water also provides efficient thermal conditioning of the sensor device 95. In the case of 'dry' lithographic tools, heat from sensor electronics in conventional sensors without water cooling can reach the surface of the mirrors and cause changes in the optical properties of the mirrors; for lithographic tools using immersion technology, heat can be drawn from a sensor by evaporation of the immersion fluid, thereby changing sensor operation due to temperature changes The use of flowing water within sensor 95 overcomes such problems by providing a constant uniform source of heat removal that provides uniform sensor operation.

In one configuration of the invention, chip 25 can be isolated from water in region 96 by an appropriate barrier, such as an epoxy coating, thereby preventing water damage of electronic devices.

Although a static water-filled region 96 could be employed in sensor 95, the use of flowing water has additional advantages. For example, because water is constantly replenished, evaporation of water in region 96 is not a concern. Exact filling of region 96 is also not a concern, since flowing water can automatically fill region 96. In addition, the flowing water provides more efficient cooling of sensor 95, which helps to prevent internal transients within the sensor.

In one configuration of the present invention, internal surfaces of sensor 95, such as surfaces 98, are provided with a hydrophilic material, such as any suitable hydrophilic coating. The hydrophilic material can be employed to minimize bubbles when flowing water is used as the flowing liquid, because a hydrophilic material acts to prevent formation of water bubbles which could interfere with radiation propagation and detection within region 96.

For embodiments in which flowing water or other liquid is used, any suitable mechanism for generating a flow of liquid can be used. For example, in one embodiment, a pump can be used. In one embodiment, liquid is pumped into the sensor at a slightly higher pressure than the pressure at which it is extracted. In one embodiment, the extraction can be passive (i.e., it can simply be drained at a controlled rate). Similarly, the filling with liquid can be passive (e.g., without a pump, by use of water pressure from the facility in which the system is located). The liquid may or may not be passed through a regulator prior to introduction to the sensor 95.

Although a luminescence, or quantum conversion, layer has not been shown in the embodiments of FIGS. 11 to 17, one may be provided as convenient on the sensor or elsewhere. It will also be appreciated that features from the different embodiments of the invention may be combined.

The radiation-receiving element may comprise a grating and or an element having a pinhole, depending on the function of the sensor.

The sensors may be located at the level of the substrate and in particular such that the radiation-receiving element 21 is at substantially the same distance from the final element of the projection system as the substrate W.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A sensor for use at a substrate level in a lithographic projection apparatus having a projection system configured to project a patterned radiation beam onto a target portion of a substrate, the sensor comprising:
    a radiation detector;
    a transmissive plate having a front surface and a back surface, the transmissive plate being positioned such that radiation projected by the projection system passes into the front surface of the transmissive plate and out of the back surface thereof to the radiation detector, the back surface comprising a structure being constructed to improve transmission of the radiation to the radiation detector, the structure being selected from the group consisting of: surface roughness of the back surface, a Fresnel lens, a Winston cone, a cylindrical projection having a distal end comprising a concave shape, or a spherical lens; and
    a gap region disposed between the transmissive plate and radiation detector, wherein a flowing liquid medium is disposed in the gap region.

2. The sensor according to claim 1, wherein a pump is used to generate the flow of the liquid medium.

3. The sensor according to claim 1, wherein the flowing liquid medium comprises water.

4. The sensor according to claim 1, wherein the sensor is an ILIAS sensor or a TIS sensor.

5. The sensor according to claim 1, wherein the gap region comprises an inlet and outlet that are each disposed in a peripheral portion of the gap region, the peripheral portions lying outside a region between the transmissive plate and radiation detector.

6. The sensor according to claim 1, wherein the radiation detector is a camera chip.

7. The sensor according to claim 1, further comprising a luminescent layer disposed between the transmissive plate and the radiation detector.

8. The sensor according to claim 7, wherein the luminescent layer is disposed on a back surface of the transmissive plate.

9. The sensor according to claim 7, wherein the luminescent layer is disposed on a surface of the radiation detector.

10. The sensor according to claim 1, further comprising a hydrophilic layer disposed on internal surfaces of the gap region.

11. A sensor for use at a substrate level in a lithographic projection apparatus having a projection system that is configured to project a patterned radiation beam onto a target portion of a substrate, the sensor comprising:
    a radiation detector;
    a transmissive plate having a front surface and a back surface, the transmissive plate being positioned such that radiation projected by the projection system passes into the front surface of the transmissive plate and out of the back surface thereof to the radiation detector, the back surface comprising a structure being constructed to improve transmission of the radiation to the radiation detector, the structure being selected from the group consisting of: surface roughness of the back surface, a Fresnel lens, a Winston cone, or a spherical lens; and
    a gap region disposed between the transmissive plate and radiation detector, wherein the gap region is configured to house an index-matched fluid, the index-matched fluid comprising a refractive index similar to that of the transmissive plate.

12. The sensor of claim 11, wherein the index-matched fluid is water, and wherein Fresnel reflections for radiation passing out of the back surface of the transmissive plate are reduced.

13. The sensor of claim 11, wherein the transmissive plate comprises quartz.

14. The sensor of claim 11, wherein the index-matched liquid is a flowing liquid.

15. The sensor of claim 14, further comprising an inlet and outlet that are each disposed in a peripheral portion of the gap region, the peripheral portions lying outside a region between the transmissive plate and radiation detector, whereby the flowing liquid enters and exits the gap region.

16. A sensor for use at a substrate level in a lithographic projection apparatus having a projection system that is configured to project a patterned radiation beam onto a target portion of a substrate, the sensor comprising:
    a radiation detector;
    a transmissive plate having a front surface and a back surface, the transmissive plate being positioned such that radiation projected by the projection system passes into the front surface of the transmissive plate and out of the back surface thereof to the radiation detector, the back surface comprising a structure being constructed to improve transmission of the radiation to the radiation detector, the structure being selected from the group consisting of: surface roughness of the back surface, a Fresnel lens, a Winston cone, or a spherical lens;
    a gap region disposed between the transmissive plate and radiation detector;
    a flowing liquid medium disposed within and passing through the gap region, the liquid medium configured to conduct heat away from the sensor;
    a luminescent layer disposed between the back surface of the transmissive plate and the radiation detector; and
    a protective coating disposed on the radiation detector.

17. The sensor of claim 16, wherein the liquid medium is water.

18. The sensor of claim 16, wherein the transmissive plate comprises a material that is index matched to the liquid medium, wherein Fresnel reflections for radiation passing out of the back surface of the transmissive plate are minimized.

19. The sensor of claim 16, further comprising a hydrophilic layer disposed on internal surfaces of the gap region.

20. The sensor of claim 16, wherein the sensor is one of a TIS sensor and an ILIAS sensor.

21. A sensor for use in a lithographic apparatus having a projection system, comprising:
    a radiation detector;
    a transmissive plate having a front surface and a back surface; and
    a gap region disposed between the transmissive plate and radiation detector, wherein a flowing liquid medium is disposed in the gap region;
    the transmissive plate being positioned such that radiation projected by the projection system passes into the front surface of the transmissive plate and out of the back surface thereof to the radiation detector, the back surface comprising a structure being constructed to improve transmission of the radiation to the radiation detector, the structure being selected from the group consisting of: surface roughness of the back surface, a Fresnel lens, a Winston cone, or a spherical lens.

22. The sensor of claim 21, wherein the liquid medium is water.

23. The sensor of claim 22, wherein the liquid medium has a refractive index similar to that of the transmissive plate.

* * * * *